United States Patent [19]
Noorbehesht

[11] Patent Number: 5,402,121
[45] Date of Patent: Mar. 28, 1995

[54] NUMERIC KEYPAD INTEGRATION SYSTEM

[75] Inventor: Farzad Noorbehesht, Aliso Viejo, Calif.

[73] Assignee: AST Research, Inc., Irvine, Calif.

[21] Appl. No.: 144,582

[22] Filed: Oct. 28, 1993

Related U.S. Application Data

[63] Continuation of Ser. No. 786,735, Nov. 1, 1991, abandoned.

[51] Int. Cl.$^6$ .......................................... H03M 11/20
[52] U.S. Cl. ........................................ 341/26; 341/22
[58] Field of Search ................. 341/20, 22, 23, 26; 235/146; 400/473; 364/704, 709.01, 709.02, 709.09; 345/168

[56] References Cited

U.S. PATENT DOCUMENTS

| | | | |
|---|---|---|---|
| 4,689,761 | 8/1987 | Yurchenco | 235/146 X |
| 4,922,248 | 5/1990 | Shiga | 341/26 X |
| 5,049,863 | 9/1991 | Oka | 340/709 X |
| 5,063,376 | 11/1991 | Chang | 340/711 X |

Primary Examiner—Michael Horabik
Attorney, Agent, or Firm—Knobbe, Martens Olson & Bear

[57] ABSTRACT

A system for integrating an external numeric keypad with a keyboard on a portable computer wherein the keypad communicates with the system BIOS through the keyboard. The keyboard includes 82 or 83 keys and an internal keyboard controller connected to a switch matrix. The controller repeatedly scans the switch matrix to determine if one or more keys has been pressed and generates scan codes for the active keys which are then output to the computer BIOS. The keypad includes 17 numeric and cursor control keys. The keypad is controlled by an internal keypad controller which is connected to a switch matrix. The keypad controller scans the keypad switch matrix to determine if one or more keys has been pressed and to generate scan codes for the active keys. The scan codes generated by the keypad controller are sent to the keyboard controller through an auxiliary port in the computer system. The keyboard controller converts the scan codes received from the keypad controller into switch locations. The switch locations are then converted into scan codes and sent to the system BIOS by the keyboard controller. An auto-sensing routine is further provided to detect the type of external device connected at the auxiliary port.

3 Claims, 6 Drawing Sheets

NUMERIC KEYPAD INTEGRATION SYSTEM

This application is a continuation of application Ser. No. 07/786,735, filed Nov. 1, 1991, now abandoned.

FIELD OF THE INVENTION

The invention relates to computer keyboards and, in particular, to a system for integrating a numeric keypad with a keyboard on a portable computer.

BACKGROUND OF THE INVENTION

Keyboard units for portable or laptop computers are typically smaller in size than those for standard or desktop personal computers. Due to space constraints, keyboards for portable computers commonly include only 82 or 83 keys, as opposed to the 101 or 102 keys provided on a standard or "full-size" keyboard. Because of the smaller number of keys on the laptop keyboards, some keys are typically "embedded" in the keyboard, and are available only after a designated control key is activated. Most often, the embedded keys correspond to a number pad which is enabled by activating a "Num Lock" key on the keyboard. After the Num Lock key has been activated, the embedded keys on the keyboard are remapped to generate scan codes corresponding to numeric, rather than alpha, keys.

While these types of embedded number pads do provide access to numeric keys in a keypad configuration, many users of laptop computers would prefer the use of a separate numeric keypad which can be used simultaneously with the other alphanumeric and function keys on the keyboard. A full-size non-embedded keypad is particularly desirable for use with accounting and spreadsheet software programs. Integration of a separate keyboard including a full-size number pad with the existing keyboard, however, is not straightforward, as certain key combinations can interfere and cause inaccurate data to be sent to the system processor. For example, in some instances, when the shift key is pressed on the full-size keyboard in connection with another alphanumeric key, the computer Basic Input-/Output System (BIOS) receives the make code for the shift key along with the scan code for the pressed key. In other instances, the shifted scan code is generated by the keyboard itself and then sent to the BIOS. Difficulties can arise when the scan code for a particular key is generated by the keyboard itself. In this case, when the shift key on the laptop keyboard is depressed simultaneously with an alphanumeric key on the full-size keyboard whose scan code is generated by the keyboard, the computer BIOS receives a shift scan code and an unshifted alphanumeric scan code. This can result in alternating shifted/unshifted key values, and in some cases, can cause the system to crash. In addition, use of a full-size keyboard with a portable computer increases the size of the system and significantly limits mobility.

SUMMARY OF THE INVENTION

The present invention provides a numeric keypad for use with a portable computer wherein full integration between the keypad and the portable keyboard is achieved. The portable computer includes a keyboard having 82 or 83 alphanumeric and function keys, and a designated portion of the keyboard is enabled to provide a number pad when a Num Lock key is activated. The system further includes an auxiliary port to which external devices may be connected. An auto-sensing routine is provided to determine what device type has been connected to the auxiliary port.

The keyboard is controlled by an internal keyboard controller connected to a keyboard switch matrix. The keyboard controller operates in a conventional manner to repeatedly scan the switch matrix to determine if one or more contact switches is closed, indicating a key has been pressed. The results of the keyboard scanning operations are written into a matrix table. An active key location table stores the matrix table entries representing closed key locations and status bits indicating the status of each active key. The active key locations are used as a base address for a lookup table which stores key location in industry standard IBM format. The IBM key location retrieved from the first lookup table is used as an address for a second lookup table containing the scan codes associated with each key. The scan code retrieved from the second lookup table is output to a keyboard buffer. The data from the buffer is sent to the system BIOS through an output port which generally corresponds to the interface output port of a desktop computer.

In accordance with the present invention, a separate, external numeric keypad for use with the portable keyboard is provided which is connected to the auxiliary port of the computer system. The keypad includes 17 numeric and cursor control keys arranged in a standard keypad configuration and is controlled by an internal keypad controller. The keypad controller is connected to a keypad switch matrix and operates in a manner similar to the keyboard controller to generate scan codes for keys which have been pressed on the keypad. The scan codes generated by the keypad are sent to the keyboard controller. The keyboard controller receives the scan codes and converts the keypad scan codes into switch locations using a switch location lookup table.

The switch location retrieved is then used as an address for the matrix table where the keyboard indicates that the switch is closed. Once the keyboard controller designates the switch as closed, it stores the location and status of the key in the active key location table, addresses the IBM key location table, and addresses the scan code table to transmit the scan code for the particular key to the system BIOS. By providing the scan codes from the keypad to the BIOS through the keyboard controller, the system BIOS receives the scan codes for the keys on the numeric keypad in the same manner as it receives the scan codes for the keys on the portable keyboard and full integration is achieved.

A method of interfacing an external numeric keypad with a portable computer system having a built-in keyboard and a processor is disclosed comprising the steps of providing an internal keyboard controller for detecting the activation of keys on the built-in keyboard and transmitting scan codes to the processor, providing an external keypad that includes a keypad controller therein, wherein the keypad controller is responsive to the activation of keys on the keypad to generate scan code data, the scan code data provided as serial data from the keypad to the internal keyboard controller, receiving the serial data form the keypad, generating at least one scan code responsive to the serial data and further responsive to any keys that may have been activated on the keyboard, the generated scan code corresponding to the scan code generated by a conventional keyboard having a built-in numeric keypad, and transmitting the generated scan code to the processor.

The present invention provides a system for integrating an external numeric keypad with a built-in keyboard on a portable computer that does not have a separate numeric keyboard wherein the system comprises a keyboard controller associated with the built-in keyboard that detects the activation of keys on the built-in keyboard and transmits scan codes to a processor. A keypad controller associated with the external numeric keypad detects the activation of a key on the keypad and transmits at least one serial scan code as an output signal. Means within the keyboard controller receive the serial scan code from the keypad controller and generate at least one scan code responsive to the serial scan code and further responsive to any keys that may be activated on the built-in keyboard, wherein the generated scan code corresponds to the scan code generated when the corresponding key is activated on a conventional keyboard having a built-in numeric keypad. The generated scan code is then transmitted to the processor.

DETAILED DESCRIPTION OF THE PREFERRED EMBODIMENT

Figure 1:
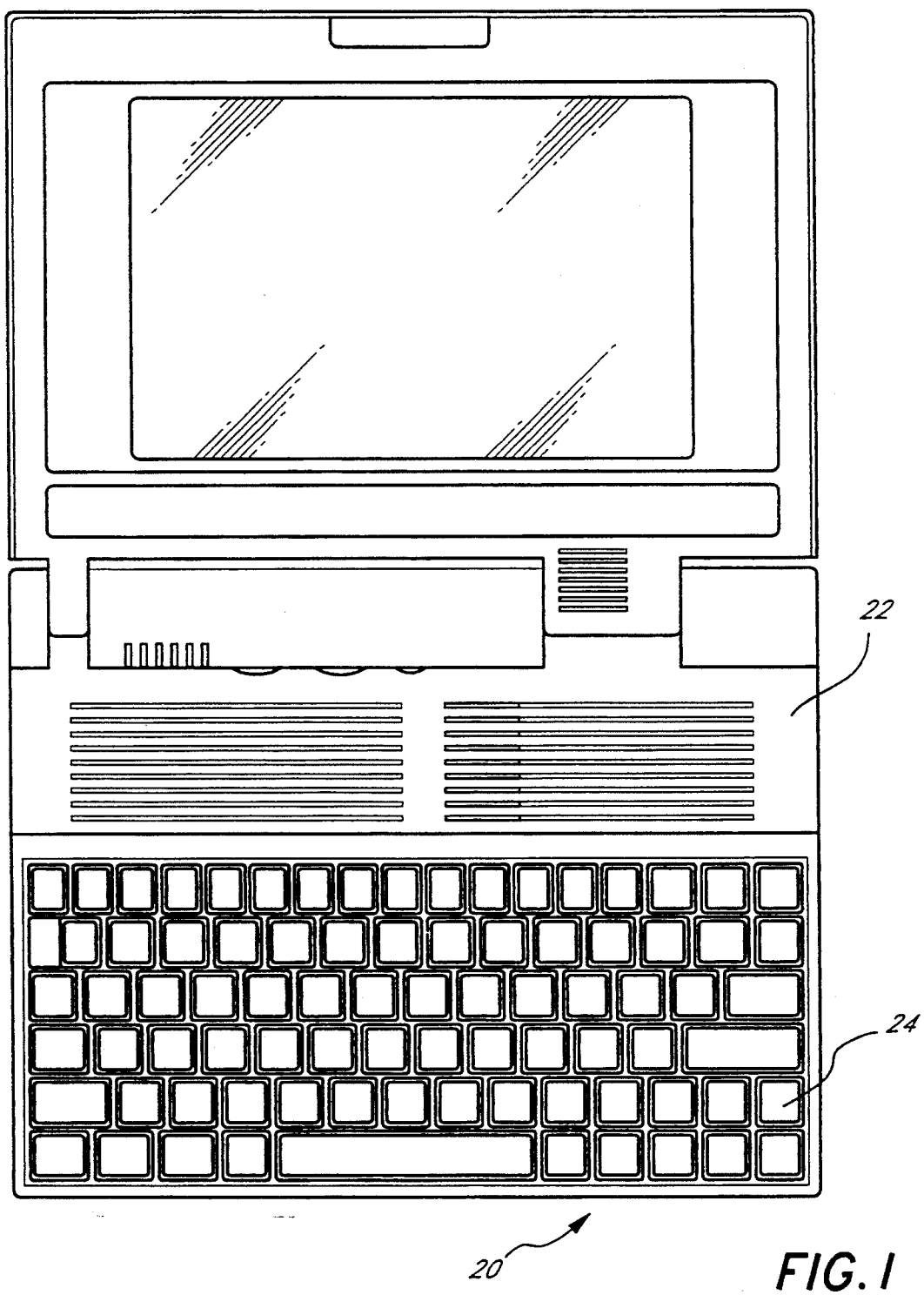
FIG. 1 illustrates a keyboard for a portable computer in accordance with the present invention.

FIG. 1 illustrates a computer keyboard 20 for a portable computer system 22 in accordance with the present invention. The keyboard preferably includes 82 alphanumeric, cursor control, and function keys arranged in the manner shown. A designated portion of the keyboard is preferably enabled to provide a number pad when a Num Lock key 24 is activated. For example, the M, J, K, L, :, U, I, O, P, and 0 keys are alternatively designated as the 0, 1, 2, 3, +, 4, 5, 6, —, and * keys, respectively. When the Num Lock key 24 is activated, the designated keys are remapped to generate the scan codes of the numeric keys rather than the scan codes of the alpha keys. In this manner, the portable keyboard 20 provides the same number of key functions as does a full-size keyboard using a fewer number of keys. The system 22 preferably includes an auxiliary port (not shown) which provides a connection for a mouse or a full-size external keyboard.

Figure 2:
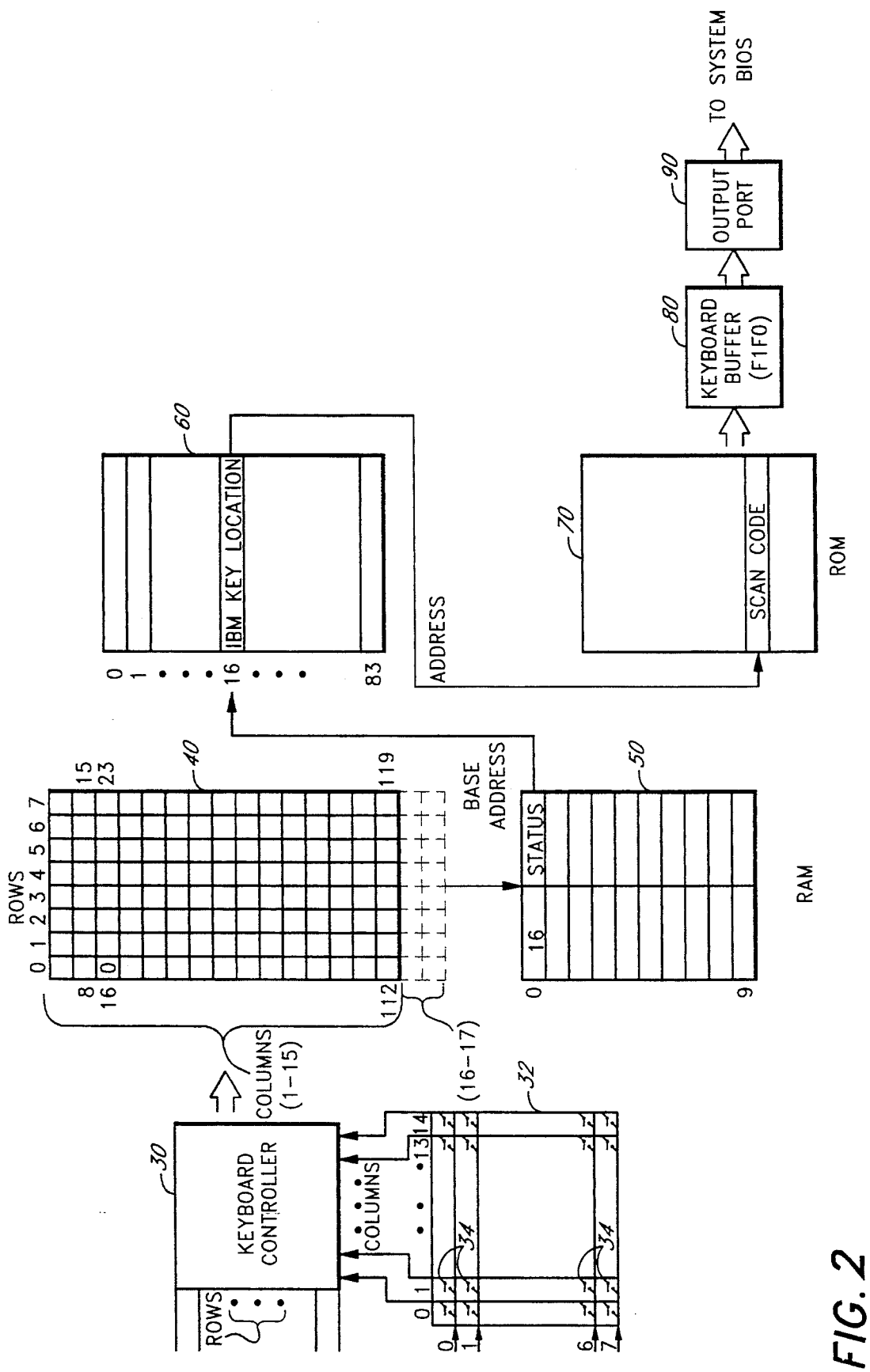
FIG. 2 is a block diagram for the keyboard shown in FIG. 1.

As illustrated in the block diagram of FIG. 2, the keyboard 20 includes a keyboard controller 30 connected to a keyboard switch matrix 32. Preferably, the keyboard controller is an Intel 8031 Microcontroller. The keyboard matrix 32 comprises a plurality of contact switches 34 which are electrically arranged in rows and columns such that each switch corresponds to a specific key on the keyboard. In particular, the matrix includes 8 rows and 15 columns. The keyboard controller 30 is connected to each row and each column input of the switch matrix 32. Although the keyboard 20 has only 82 or 83 keys, those skilled in the art will recognize that an 8×15 switch matrix is necessary to accommodate the five additional columns needed for the Ctrl, ShiftL (left-hand shift), ShiftR (right-hand shift), Alt, and Fn (function) keys. Preferably, as shown, the keyboard controller and the keyboard are combined in a single unit integrated with the computer system 22.

The keyboard controller 30 operates in a conventional manner to repeatedly scan the plurality of contact switches 34 associated with the keys to determine if one or more contact switches is closed. The keyboard controller 30 is controlled by an internal keyboard microprocessor that generates row output signals. When a switch 34 is activated, i.e., closed, by depressing the associated key on the keyboard 20, the column line for that switch is electrically connected to the row line of that switch. When a row signal is communicated to a closed switch via its row line, the row signal is communicated to the column line. The keyboard microprocessor can thereby determine whether a switch 34 is closed by sequentially activating the row inputs and reading the column outputs to detect whether one of the row lines is active.

The controller 30 further includes a matrix table 40 stored in RAM (not shown). The matrix table 40 is arranged in a row by column orientation and includes a unique table location for each key on the keyboard 20. In the matrix table 40, the controller 30 stores the results of the matrix scanning operation in sequential memory locations. A 0 in a particular table location indicates a closed switch and a 1 in a table location indicates an open switch. The 0's and 1's are written into the appropriate locations in the matrix table using well known open and close routines. For example, when key 16 is pressed on the keyboard 20, the controller 30 writes a 0 in the matrix table 40 at memory location 16.

The matrix entries representing closed key locations are then converted into entries in an active key location table 50 also stored in RAM. The active key location table 50 holds up to ten 2-byte entries. The location of the active key is written into the upper byte, while the lower byte comprises a plurality of status bits indicating the status of the active key. Thus, for example, at location 0 in the active key table, 16 is written in the upper byte to indicate that key 16 is active, and status information regarding key 16 is written into the lower byte.

The upper bytes stored in the active key location table 50 are used as a base address for a first lookup table 60 stored in ROM (not shown). The first lookup table 60 stores key locations in industry-standard IBM format. The IBM key location retrieved from the first lookup table 60 is then used as an address for a second lookup table 70, also in ROM, which stores the Scan codes associated with the keys on the keyboard 20. As the scan code for each key on the keyboard 20 is unique, each lookup table 60, 70 includes at least 83 memory locations. Once the scan code has been retrieved for a particular key, it is output to a keyboard buffer 80. The buffer 80 preferably is a conventional 16-byte First-In First-Out (FIFO) buffer. The output of the buffer 80 is input to a one-byte output port 90 which stores the scan code. The output port 90 generally corresponds to the keyboard interface output port of a conventional desktop computer. The data from the output port 90 is then sent to the system BIOS where it is processed in a conventional manner.

Further details regarding the operation and configuration of the keyboard controller can be found in copending U.S. patent application Ser. No. 07/612,810, entitled "Memory Mapped Keyboard Controller", filed on Nov. 9, 1990, (now issued Jan. 18, 1991 as U.S. Pat. No. 5,280,283), and assigned to the assignee of the present invention.

Figure 3:
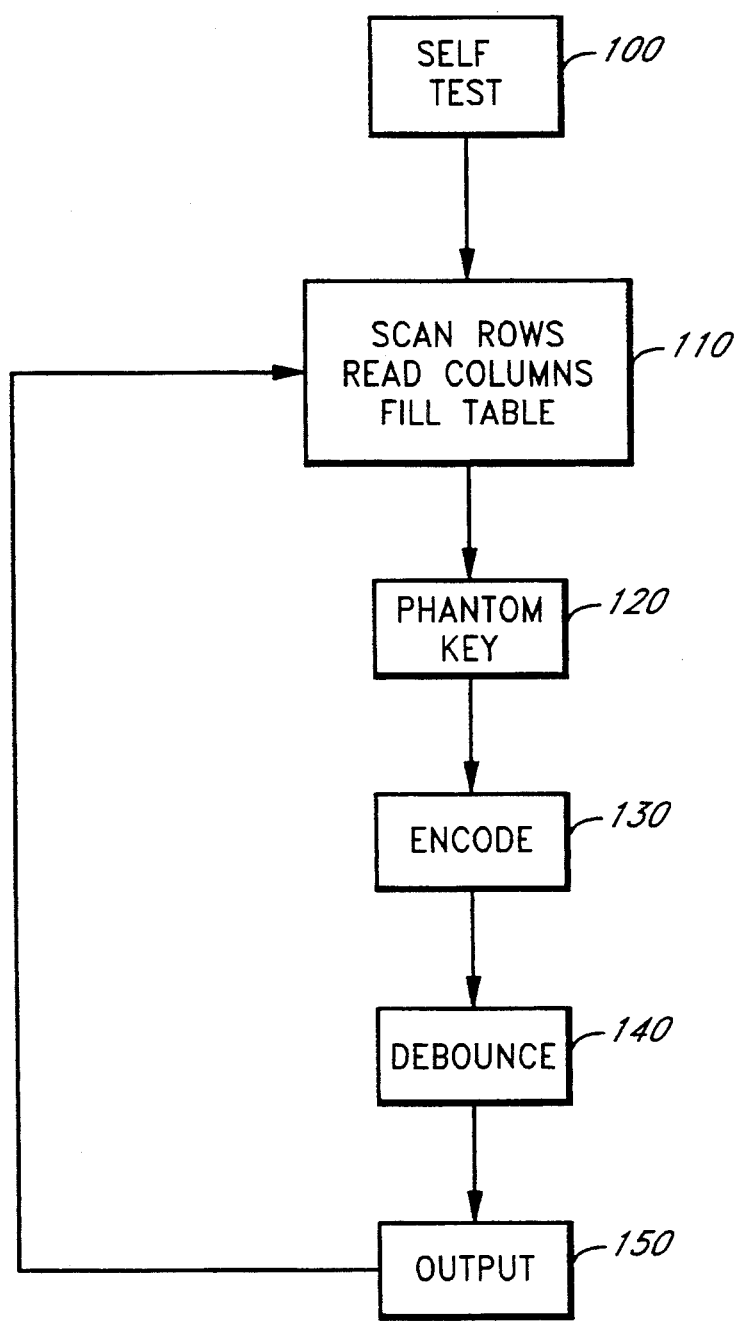
FIG. 3 is a flow diagram illustrating the sequence of operations of the keyboard.

The keyboard controller operations are summarized in the flow diagram depicted in FIG. 3. Upon power-up, the controller 30 runs through a standard self-test operation as depicted by an activity block 100. At completion of the self-test operation, the controller 30 scans the row inputs of the switch matrix 32, reads the column outputs, and fills the matrix table 40 to identify closed switches representing active keys in an activity block 110. After the matrix table 40 has been filled, a phantom key routine is performed in an activity block 120. In the phantom key routine, the information stored in the matrix table 40 is read to identify potential phantom keys. As is well-known to those skilled in the art, a potential phantom key is identified by comparing two columns in the matrix table 40 and determining if three switches are closed or if two switches in a common row are closed. If a potential phantom key is detected, a phantom key flag is set. Conversely, if no potential phantom keys are detected, the keyboard controller 30 clears the flag.

After any potential phantom keys have been detected, the keyboard controller 30 then encodes the matrix table data, as depicted by activity block 130. During the encoding process, the keyboard controller 30 checks the phantom key flag updated during the phantom key routine 120. If the flag is set, the system cannot determine whether a phantom key or a real key has been pressed. In this situation, the keyboard 20 is then disabled and the controller 30 returns to the scanning routine 110. When the key triggering the potential phantom key is released, the keyboard 20 is again enabled and normal operation resumes. If the phantom key flag has not been set, the matrix table 40 is read to identify the closed switch locations. The closed switch locations are then converted into a 7-bit address which is stored in the upper byte of the active key table 50.

As discussed above and as illustrated in FIG. 2, the lower byte of each address in the active key location table 50 stores status information which identifies the state of each active key in the matrix table 40. A first bit indicates when the Fn key is active. A second bit is used to indicate when a key is closed, a third bit to indicate when a key is debounced, a fourth bit to indicate when a key is released, and a fifth bit to indicate when a key is reported, i.e., the scan code for that key has been sent to the system BIOS. Sixth and seventh bits are used to implement a debounce counter. When a switch 34 is closed and the third status bit is low, the debounce counter is incremented. The counter is incremented until the desired number of samples have been taken. Upon reaching this number, the third status bit is set to indicate that the key has been debounced. If the switch 34 is open, the debounce counter is decremented, and, upon reaching zero, the fourth status bit is set to indicate that the key has been released.

In the output routine depicted by an activity block 150 following the debounce 140, the active key table 50 is checked to determine if there is a new key in the table. If a new key is found, the scan code is generated in the manner described above and stored in the keyboard buffer 80. The information stored in the buffer 80 is sent to the system processor on an interrupt basis or retrieved by the processor in a scanning operation.

The keyboard 20 illustrated in FIG. 1 operates in the manner described above to generate scan codes which are sent to the system BIOS for processing. As previously mentioned, because of size constraints, the portable keyboard 20 contains a total of 82 or 83 physical keys, and the numeric keypad keys typically found on a full-size keyboard are commonly embedded keys which are available only after activating the Num Lock key. After the Num Lock key has been enabled, the designated keys on the keyboard 20 are remapped into virtual columns 16 and 17 in the matrix table. The data from the virtual columns in the matrix table is then processed as described above to generate the correct scan codes for the numeric keys.

The system includes an auxiliary port (not shown) which enables use of a full-size keyboard; however, the full-size keyboard is not integrated with the portable keyboard 20. Furthermore, use of a full-size keyboard requires much more space than the portable keyboard 20 and reduces the mobility of the system.

For a user desiring a separate, non-embedded keypad, few options are available, as integration of full-size keyboard including a non-embedded keypad is not straightforward. As discussed earlier, in some cases, scan codes for shifted keys are generated by the keyboard controller 30, while in other cases, scan codes for both the shift key and the depressed key are sent to the system BIOS which receives both scan codes and processes a shifted key scan code. When a full-size keyboard is directly interfaced with the portable keyboard 20, problems arise when the shift key on the portable keyboard is used in connection with an alphanumeric key on the full-size keyboard whose shifted scan code is generated by the keyboard. In this situation, the BIOS receives both a shift key scan code from the portable keyboard 20 and an unshifted key scan code from the full-size keyboard. In the case where the scan code for the key depressed on the full-size keyboard is generated by the keyboard controller, the controller has no way of detecting that the shift key had been pressed on the portable keyboard 20 and inaccurate scan code data is sent to the BIOS.

Figure 4:
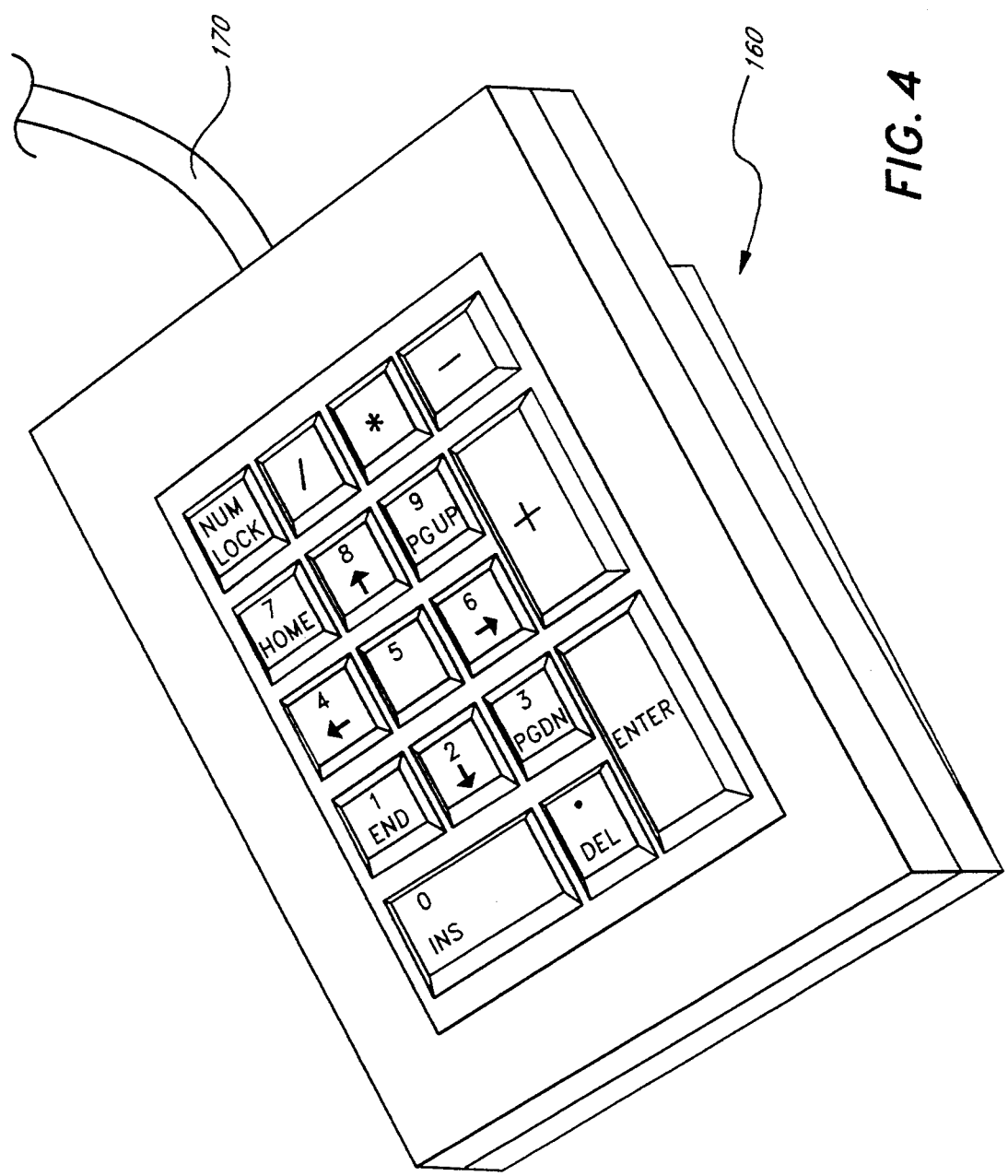
FIG. 4 illustrates a numeric keypad in accordance with the present invention.

The present invention provides a system for integrating a separate numeric keypad with a portable computer system as described such that all functions of a full-size keyboard are provided. Such a keypad 160 is illustrated in FIG. 4 and includes 17 numeric and cursor control keys arranged in a standard keypad configuration. In accordance with the integrated system of the invention, the keypad communicates with the keyboard controller 30 via a cable 170 which is connected to the auxiliary port with a suitable connector.

Figure 5:
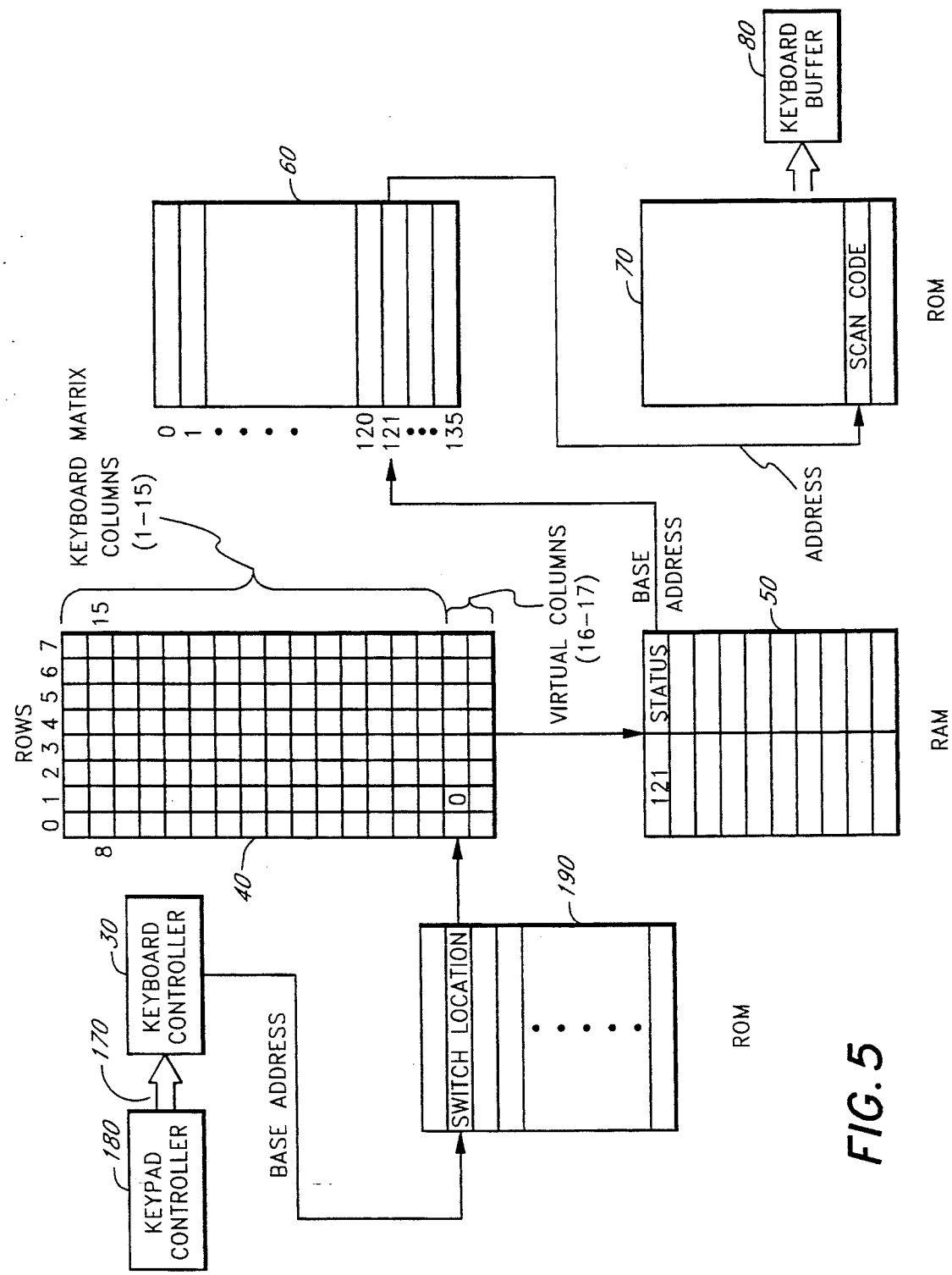
FIG. 5 is a block diagram for the keyboard and keypad.

Referring to FIG. 5, the keypad 160 includes a keypad controller 180 which communicates with the keyboard controller 30 via standard 101/102 keyboard interface over the cable 170. Preferably, the keypad controller 180 is an Intel 8031 Microcontroller combined with external RAM. In operation, the keypad 160 is connected to an auxiliary port in the computer system, and is preferably connected to the mouse port.

An auto-sensing routine is provided to determine what type of device has been connected to the auxiliary port. When the system boots, the BIOS issues a reset command to the keyboard via the keyboard controller 30 to begin the keyboard internal self-testing process. Upon receiving the reset command from the BIOS, the keyboard controller 30 checks the device type. If the device type is not defined, the reset command is sent to the auxiliary port to poll the auxiliary device. If there is no response, the device type is set to NONE. If there is a device present, the keyboard controller 30 reads the first byte and passes it to the host as an acknowledge byte. The second byte from the device contains the results of the self test and is read and stored by the controller 30. The third byte received from the device indicates the device type. If there is a time-out on the third byte, the device type is set to KEYBOARD and the second byte is sent to the host. If the third byte read is 00H, the device type is set to MOUSE, and if the third byte is read as 60H, the device type is set to NUMERIC KEYPAD. As the auto-sensing is performed during the system boot, if an auxiliary device is connected to the port while the system is on, the system must be rebooted to initiate the auto-sensing process.

Once it has been established that the numeric keypad 160 has been connected to the auxiliary port, the system begins the scanning process previously described. The keypad controller 180 includes a keypad switch matrix which comprises a plurality of contact switches electrically arranged in columns and rows so that each switch corresponds to a unique key on the keypad. Preferably, the keypad switch matrix comprises 3×4 matrix. The keypad controller 180 is connected to each row and column of the switch matrix and operates in a manner similar to the keyboard controller 30 to repeatedly scan the matrix to determine if one or more contact switch is open or closed. The keypad controller 180 then fills a matrix table stored in external RAM, reads the matrix table to identify the active keys, and determines the scan codes for the active keys in accordance with the procedure illustrated and described in connection with FIG. 3.

The scan codes generated by the keypad controller 180 are sent to the keyboard controller 30. The communication between the keypad controller and the keyboard controller is via the standard 101/102 keyboard interface via the cable 170 connected to the auxiliary port and the data is in the form of scan code set 2. See the IBM ® Personal System/2 ™ Model 50 and 60 Technical Reference Manual, ©1987, for additional detail regarding the standard interface and the scan code set.

The scan codes received from the keypad controller 180 by the keyboard controller 30 are then used as a base address for a switch location lookup table 190 stored in ROM which converts the keypad scan codes into switch locations. The switch location retrieved from the lookup table is then used as an address for the virtual columns (16 and 17) in the matrix table 40. The keyboard controller accesses the switch location indicated by the switch location table and writes a 0 at that location to indicate a closed switch. Once the keyboard controller 30 has designated the switch as closed in the matrix table 40, the controller 30 operates in the manner previously described to store the location and status of the key in the active key location table 50, address the IBM key location table 60, and address the scan code table 70 to transmit the scan code for that particular key to the system BIOS. Thus, the system BIOS receives the scan codes for the keys on the numeric keypad 160 in the same manner as it receives the scan codes for the keys on the portable keyboard 20. By providing the scan codes from the keypad 160 to the BIOS through the keyboard controller 30, the BIOS never receives conflicting scan code data and full integration is achieved.

Figure 6:
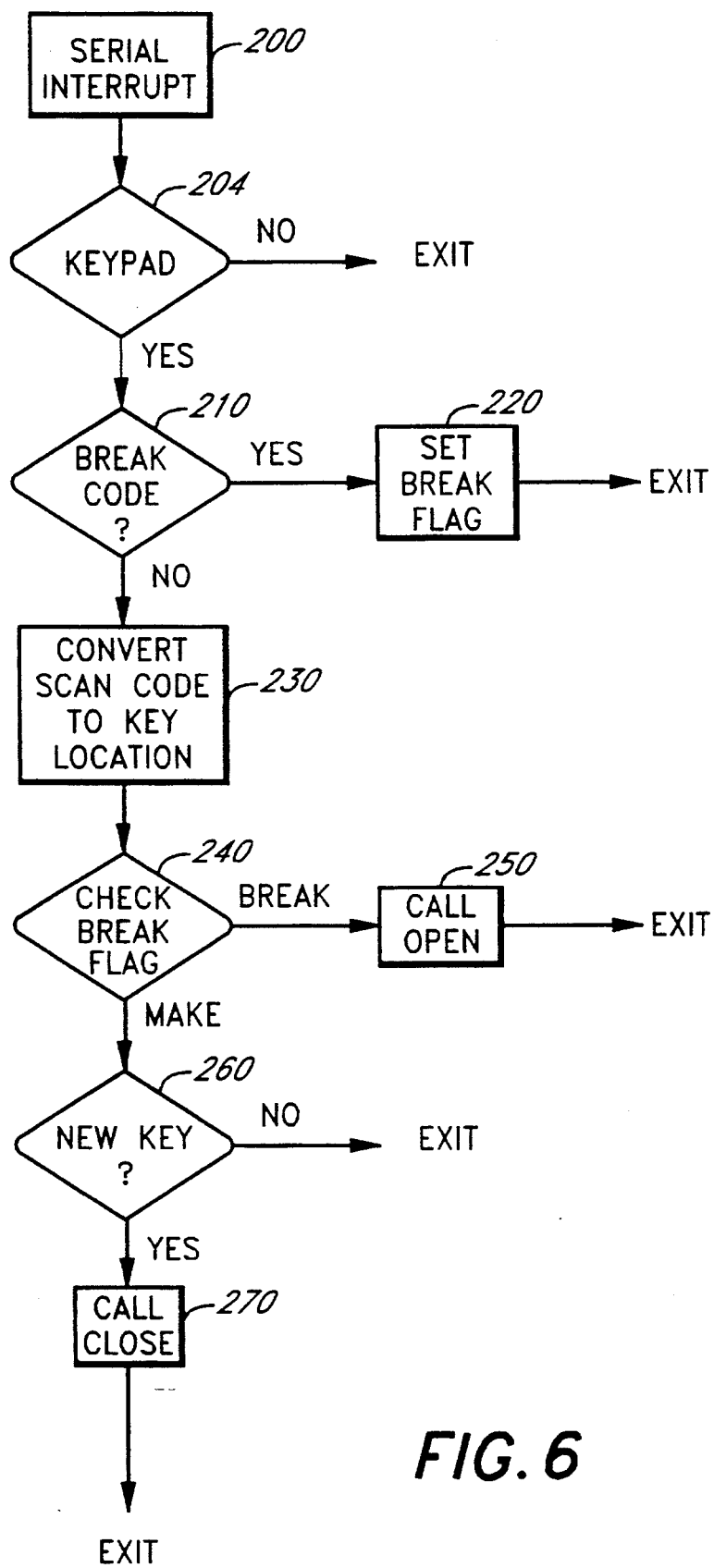
FIG. 6 is a flow diagram illustrating the sequence of operations of the keyboard and keypad.

The keyboard controller 30 receives and processes the data from the keypad controller 180 in accordance with the flow diagram illustrated in FIG. 6. In activity block 200, the keyboard controller 30 receives a serial interrupt from the keypad controller 180. Upon receipt of the interrupt, the keyboard controller 30 checks the device type to determine if a keypad is present as indicated by decision block 204. If the device type is set to KEYBOARD or MOUSE, the keyboard controller 30 exits the data processing routine and the scan code data received by the controller is converted from serial data to parallel data and then sent to the system processor via the output port 90.

If the device type is set to NUMERIC KEYPAD, the keyboard controller checks the scan code from the keypad controller 180 for the presence of a break code in a decision block 210. As set forth above, the scan codes generated in the system of the present invention are in industry standard IBM 101/102 format. As is well known to those skilled in the art, the scan codes that are sent to the system BIOS are in the form of a make code when a key is pressed, followed by a break code sent to the system BIOS when the key has been released. Further information on the IBM Scan Code Set 2 can be found in the IBM ® Personal System/2 ™ Model 50 and 60 Technical Reference Manual, ©1987. As the keyboard controller 30 is not in direct contact with the keypad switch matrix, the controller must instead search for the presence of a break code to determine if a key on the numeric keypad has been released. If a break code is detected, the keyboard controller sets a break flag as indicated at activity block 220 and then exits the data processing process. If no break code is detected, the scan code data received from the keypad controller 180 is converted into a key location in the manner described above in an activity block 230.

After the scan code conversion, the keyboard controller 30 next checks the break flag in a decision block 240. If the break flag is set, the keyboard controller 30 calls the open routine in an activity block 250 to set the corresponding key location in the switch matrix 40 to a 1 to indicate an open switch. If the break flag is not set, indicating a make code, the controller 30 checks the active key location table to determine if a new key has been pressed in a decision block 260. If a new key has not been pressed, the controller exits the data processing routine. If a new key has been pressed, the controller calls the close routine to write a 0 into the corresponding location in the matrix table indicating a closed switch, in an activity block 270 and then exits the data processing routine.

Thus, with the integration system of the present invention, when the shift key on the portable keyboard 20 is pressed in conjunction with the / key on the numeric keypad 160, the system BIOS receives the make code for the shift key along with the shifted scan code for the / key. In this manner, the foregoing system fully emulates an integrated numeric keypad while simultaneously maintaining system portability and mobility.

What is claimed is:

1. A method of interfacing an external numeric keypad with a portable computer system having a built-in keyboard and a processor, comprising the steps of:
   providing an internal keyboard controller for detecting the activation of keys on said built-in keyboard, wherein said keys on said built-in keyboard are mapped within said keyboard controller, and transmitting scan codes to said processor;
   providing an external keypad that includes a keypad controller therein, said keypad controller responsive to the activation of keys on said keypad to generate scan code data which is mapped in accordance with the configuration of keys on said keypad, said scan code data provided as serial data from said keypad to said internal keyboard controller;

transmitting said serial data from said keypad to said keyboard controller;

re-mapping said serial data within said keyboard controller, so as to allow for use of said external keypad while equivalent keys are operational on said built-in keyboard;

generating at least one scan code by said keyboard controller responsive to said serial data received from said keypad and further responsive to the activation of any key on said built-in keyboard, said generated scan code corresponding to a scan code generated by a keyboard having a built-in numeric keypad when keys equivalent to the keys activated on said external keypad and said built-in keyboard are activated on said keyboard having said built-in numeric keypad; and transmitting said scan code generated by said keyboard controller to said processor.

2. A system for integrating an external numeric keypad with a built-in keyboard on a portable computer that does not have a separate numeric keyboard, said system comprising:

a keyboard controller associated with said built-in keyboard that detects the activation of keys on said built-in keyboard and transmits scan codes to a processor, and wherein said scan codes are mapped in accordance with the configuration of said keys on said keyboard;

a keypad controller associated with said external numeric keypad that detects the activation of a key on said keypad and transmits at least one serial scan code as an output signal, and wherein said serial scan code is mapped in accordance with the configuration of keys on said keypad; and means within said keyboard controller for receiving said serial scan code from said keypad and for re-mapping said serial scan code so as to allow for use of said external keypad while equivalent keys are operational on said built-in keyboard, said re-mapping of said serial scan code generating at least one scan code at said keyboard controller responsive to said serial scan code received from said keypad and further responsive to the activation of any key on said built-in keyboard, said generated scan code corresponding to a scan code generated by a keyboard having a built-in numeric keypad when keys equivalent to the keys activated on said external keypad and said built-in keyboard are activated on said keyboard having said built-in numeric keypad, said scan code generated by said keyboard controller being transmitted to said processor.

3. A portable computing system, comprising:

a portable computer having a microprocessor and a built-in reduced size keyboard wherein the key functions associated with a numeric keypad on a full-size keyboard are provided by keys in the alphanumeric portion of the reduced size keyboard such that the numeric keypad functions cannot be used at the same time as the alphanumeric functions for said keys of said alphanumeric portion of the reduced sized keyboard, said portable computer having an auxiliary input port;

a separate numeric keypad having a serial output cable for communicating serial data, which is mapped in accordance with the configuration of keys on said keypad, from said separate numeric keypad to said auxiliary input port of said computer, said separate numeric keypad providing numeric keypad functions independent of the alphanumeric portion of the reduced sized keyboard; and a keyboard controller in said reduced size keyboard for re-mapping said serial data, so as to allow for use of said external keypad while equivalent keys are operational on said built-in keyboard, said re-mapping of said serial data also integrating said serial data from said separate numeric keypad in combination with the activation of control keys on said reduced size keyboard so that scan codes communicated to said microprocessor from said keyboard controller in said reduced size keyboard in response to the activation of keys on said separate numeric keypad correspond to scan codes generated by a full-size keyboard when corresponding keys are activated on a keyboard and a numeric keypad of said full-size keyboard.

* * * * *